US009941151B2

(12) United States Patent
Zhang et al.

(10) Patent No.: US 9,941,151 B2
(45) Date of Patent: Apr. 10, 2018

(54) METHOD FOR PRODUCING AN INTEGRATED CIRCUIT INCLUDING A METALLIZATION LAYER COMPRISING LOW K DIELECTRIC MATERIAL

(71) Applicants: IMEC VZW, Leuven (BE); Katholieke Universiteit Leuven, Leuven (BE)

(72) Inventors: Liping Zhang, Heverlee (BE); Mikhail Baklanov, Herent (BE)

(73) Assignees: IMEC vzw, Leuven (BE); Katholieke Universiteit Leuyen, Leuven (BE)

( * ) Notice: Subject to any disclaimer, the term of this patent is extended or adjusted under 35 U.S.C. 154(b) by 40 days.

(21) Appl. No.: 15/489,584

(22) Filed: Apr. 17, 2017

(65) Prior Publication Data
US 2017/0301583 A1  Oct. 19, 2017

(30) Foreign Application Priority Data

Apr. 18, 2016 (EP) .................................... 16165797

(51) Int. Cl.
*H01L 21/768* (2006.01)
(52) U.S. Cl.
CPC .. *H01L 21/76811* (2013.01); *H01L 21/76814* (2013.01); *H01L 21/76828* (2013.01); *H01L 21/76829* (2013.01); *H01L 21/76843* (2013.01); *H01L 21/76879* (2013.01)
(58) Field of Classification Search
CPC .................... H01L 21/76814; H01L 21/76811
See application file for complete search history.

(56) References Cited

U.S. PATENT DOCUMENTS

| 6,204,166 B1 | 3/2001 | McTeer |
| 8,951,911 B2 | 2/2015 | Naik et al. |
| 2006/0069171 A1* | 3/2006 | Prokopowicz ............. C08J 9/26 521/61 |

(Continued)

FOREIGN PATENT DOCUMENTS

JP    2012-138503 A    7/2012

OTHER PUBLICATIONS

Zhang, L., et al., "Damage free integration of ultralow-k dielectrics by template replacement approach," Applied Physics Letters, vol. 107, pp. 092901-1-092901-4, 2015.

(Continued)

*Primary Examiner* — Mounir Amer
(74) *Attorney, Agent, or Firm* — Knobbe, Martens, Olson & Bear LLP

(57) ABSTRACT

A method of forming a metallization layer of an IC having a lower via level and an upper trench level is disclosed. In one aspect, the method includes applying a dual damascene process to a stack of two layers. The bottom layer includes a porous low-k dielectric in which the pores have been filled by a template material. The top layer is a template layer. This stack is obtained by depositing a template layer on top of a porous low-k dielectric and annealing in order to let the template material diffuse into the pores of the low-k layer. At the end of the anneal process, a stack of a pore-filled layer and a template layer is obtained. Vias are etched in the low-k layer and trenches are etched in the template layer. The template pore-filling protects the low-k dielectric during plasma etching, metal barrier deposition and metal deposition.

17 Claims, 5 Drawing Sheets

(56) References Cited

U.S. PATENT DOCUMENTS

2011/0183525 A1 7/2011 Purushothaman et al.
2012/0252206 A1 10/2012 Naik et al.
2012/0329273 A1 12/2012 Bruce et al.
2013/0171819 A1 7/2013 Miyajima et al.
2014/0127901 A1 5/2014 Lu et al.

OTHER PUBLICATIONS

Extended European Search Report dated Oct. 10, 2016 for European Application No. EP 16165797.8, filed Apr. 18, 2016.

* cited by examiner

METHOD FOR PRODUCING AN INTEGRATED CIRCUIT INCLUDING A METALLIZATION LAYER COMPRISING LOW K DIELECTRIC MATERIAL

RELATED APPLICATIONS

This application claims priority to European application no. EP 16165797.8 entitled "METHOD FOR PRODUCING AN INTEGRATED CIRCUIT INCLUDING A METALLIZATION LAYER COMPRISING LOW K DIELECTRIC MATERIAL," filed on Apr. 18, 2016, and incorporated herein by reference in its entirety.

BACKGROUND

Technological Field

The disclosed technology is related to a method of manufacturing integrated circuits, more particularly to a method of manufacturing an integrated circuit, including a metallization layer comprising a low-k dielectric material, by forming interconnect layers in the back-end-of-line process.

Description of the Related Technology

Low-k dielectrics, in particular porous low-k materials, are introduced in the back-end-of-line (BEOL) portion of integrated circuit (IC) device manufacture, to lower the k-value (the dielectric constant) and thereby minimize signal delay and power dissipation in the interconnection of the circuitry. Sub-32 nm technology requires ultralow-k porous dielectric materials (k<2.5) for Cu interconnects in the back-end of line to reduce the RC delay. The integration of metal (usually copper) lines and vias with low-k materials by the dual damascene approach is becoming increasingly difficult as the critical dimension scales down. The key challenge is related to the weak compatibility of porous low-k dielectrics to conventional integration processing. A highly porous structure leads to severe issues with plasma processing-induced damage and penetration of the metal diffusion barrier.

The replacement of a sacrificial template by ultralow-k dielectrics was proposed to solve the above-mentioned problems. However, this approach is not applicable to form interlayer dielectrics at the via level. Due to the low patterning density at via level, the removal of a sacrificial template will lead to collapse of the metal structure. In current methods, the interlayer via is formed by conventional plasma patterning with porous low-k. Therefore, plasma induced damage and metal penetration into porous low-k leads to bad performance.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

The disclosed technology relates to a method of manufacturing integrated circuits that solves the above-mentioned problems while at the same time avoiding plasma induced damage and metal penetration into the low-k material.

One aspect of the disclosed technology is a method of manufacturing a metallization layer of an integrated circuit device. The metallization layer includes a via level and a trench level. The trench level is on top of the via level. The via level includes a first porous dielectric layer with a pattern of one or more metal-filled vias embedded therein. The trench level includes a second porous dielectric layer with a pattern of one or more metal conductors embedded therein. The method includes depositing the first porous dielectric layer. The method further includes depositing a layer of a template material directly on the first porous dielectric layer. The method further includes annealing and subsequently cooling the first porous dielectric layer and the layer of the template material so that the template material diffuses into the pores of the first porous layer, thereby filling the pores over the complete thickness of the porous layer, thus forming a pore-filled dielectric layer, and so that a template layer remains on top of the pore-filled dielectric layer. The method further includes performing a dual damascene process.

The dual damascene process includes forming via openings in the pore-filled layer and trenches in the template layer, according to the via pattern and the conductor pattern, respectively. The dual damascene process further includes filling the via openings and trenches with a barrier layer and a metal, thereby creating metal-filled vias and metal conductors. The dual damascene process further includes removing the remaining template layer on top of the pore-filled layer, and removing the template material from the pores of the pore-filled layer. The dual damascene process further includes depositing the second porous dielectric layer directly on top of the first porous layer, thereby embedding the metal conductors in the material of the second porous layer. The via pattern and the conductor pattern together form an interconnect pattern of the metallization layer, defined by a plurality of interconnects, such as electrical connections between some of the metal-filled vias in the via level and some of the conductors in the trench level. The first and second dielectric layers together form a dielectric isolator, isolating the interconnects from each other. The dual damascene process further includes planarizing the second porous dielectric layer and the metal conductors.

In an embodiment, the porous dielectric material of the first and second dielectric layers and the template material are chosen in relation to the applied etch process for etching trenches in the template layer, in such a way that the etch process is selective to the pore-filled layer.

In an embodiment, the template material is a polymer. In an embodiment, the template material is a carbon-based polymer. In and embodiment, the first and second porous dielectric layers are low k dielectric layers. In an embodiment, the barrier layer has a thickness between 1 nm and 3 nm.

In an embodiment, a first hardmask defining the pattern of the trenches is produced directly on the template layer after the annealing and cooling steps. In an embodiment, at least one further hardmask defining the pattern of the vias is produced on top of the first hardmask.

In an embodiment, the etching of the vias precedes the etching of the trenches.

In an embodiment, the etching of trenches precedes the etching of the vias

In an embodiment, a second hardmask is deposited directly on the first hardmask, and a third hardmask is deposited directly on the second hardmask. Forming the via openings includes etching through the third hardmask, stopping on the second hardmask. Forming the via openings further includes etching through the second hardmask and through the template layer, stopping on the pore-filled dielectric layer. Forming the via openings further includes etching through the pore-filled dielectric layer. Forming the trenches includes etching through the template layer, stopping on the pore-filled dielectric layer. In an embodiment, the first hardmask may be a metal or a silica hardmask, the second hardmask may be a carbon-based hardmask and the third hardmask may be a silica hardmask.

In an embodiment, a second hardmask is deposited directly on the first hardmask. Forming the via openings includes etching through the second hardmask, stopping on the template layer. Forming the via openings further includes etching through the template layer, stopping on the pore-filled dielectric layer. Forming the via openings further includes etching through the pore-filled dielectric layer. Forming the trenches includes etching through the template layer, stopping on the pore-filled dielectric layer. In an embodiment, the first hardmask may be a metal hardmask and the second hardmask may be a silica hardmask.

In an embodiment, the dielectric material of the first and second porous dielectric layers may be the same material. In an embodiment, the planarizing step may be followed by the deposition of a passivation layer on the planarized surface.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

DETAILED DESCRIPTION OF CERTAIN ILLUSTRATIVE EMBODIMENTS

Figure 1A:
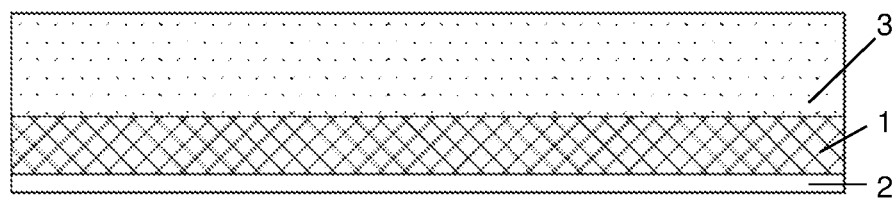
FIG. 1A illustrates an intermediate step of a process flow of a method of manufacturing a metallization layer of an integrated circuit device according to an embodiment of the disclosed technology.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

One aspect of the disclosed technology is a method to manufacture a metallization layer of an IC having a lower via level and an upper trench level. In the context of the disclosed technology, a metallization layer is a Damascene style interconnect layer that is part of the BEOL portion of an IC. The metallization layer comprises a plurality of conductive (such as metal) lines, formed by conductors that fill the trenches in the trench level and the metallization layer further comprises metal-filled vias in the via level, with some of the vias being connected to some of the conductors, according to a designed interconnect pattern. The pattern comprises or consists of a via pattern and a trench pattern. The different interconnections are isolated from each other by dielectric material, comprising or consisting of a first dielectric layer at the via level and a second dielectric layer at the trench level.

According to the disclosed technology, dual damascene processing is applied on a two layer stack. The bottom layer includes a porous low-k dielectric in which the pores have been filled by a template material. The tope "template layer" includes the template material. This stack is obtained by depositing a layer of the template material on top of a porous low-k dielectric and annealing the obtained layer stack in order to let the template material diffuse into the pores of the low-k layer. At the end of the anneal process, a stack of a pore-filled layer and a template layer is obtained. Vias are etched in the low-k layer and trenches are etched in the template layer. The template pore-filling protects the low-k dielectric during plasma etching, metal diffusion barrier deposition and metal deposition, for example by electroplating or electroless deposition/metal re-flow.

After forming the metal conductors by filling the vias and the trenches with metal, the template layer and the template filling in the pores are removed, exposing the metal conductors. The metal conductors are subsequently embedded in a further low-k dielectric layer, deposited after production of the conductors. Any dual damascene production technique known in the art is applicable to the stack of the pore-filled low-k layer and the template layer. The etching chemistry applied during the process needs to be chosen so as to be compatible with the template material and the low-k material, and equally as a function of the number and type of hardmasks applied in the process. A number of examples of process sequences are given hereafter. In the following, the terms 'fluorine plasma etch' and 'N/H/O plasma etch' are used. A fluorine plasma etch means any plasma etch method known in the art and applying a fluorine-based chemistry, such as $CF_4$, $NF_3$, $SF_6$, $CH_2F_2$, $C_4F_8$. An N/H/O plasma etch means any plasma etch method known in the art and applying a chemistry based on N, H, O or a combination thereof. Examples are $H_2$ plasma, $N_2/H_2$ plasma, or $CO_2$ plasma.

The template material has the following characteristics. Above a first temperature, such as a glass transition temperature or melting temperature, the template material can fill the pores of the low-k material without chemical modification of the low-k matrix. The template material can be removed from the low-k pores, by, for example, thermal decomposition at a second temperature, UV radiation, plasma treatment, and/or wet cleaning. The template material is mechanically and thermally stable so as to withstand back-end-of-line processing, such as plasma etch, diffusion barrier deposition, and/or chemical mechanical polishing (CMP).

A suitable material to serve as the template material is a polymer, such as a carbon-based polymer such as polystyrene (PS) or Polymethylmethacrylate (PMMA). The molecular weight should be high enough in order to obtain a sufficiently high glass transition temperature. In an embodiment, the glass transition temperature for the polymer is between 250° C. and 400° C.

FIGS. 1A-1L illustrate intermediate steps of a process flow of a method of manufacturing a metallization layer of an integrated circuit device according to an embodiment of the disclosed. As seen in FIG. 1A, the porous low-k dielectric 1 is deposited on a base substrate 2, which may be the front-end-of-line (FEOL) part of an IC or the surface of a passivation layer that covers an underlying metallization layer of the IC. The porous low-k layer 1 may be applied by a chemical vapour deposition or spin-on technique, for example, in a thickness between 30 and 50 nm. The thickness of the low-k layer 1 corresponds to the thickness of the via level of the metallization layer that is to be produced.

In the context of the present description, low-k materials are defined as dielectrics which have a dielectric constant that is lower than the dielectric constant of $SiO_2$. In an embodiment, the dielectric constant is between 2 and 2.4. In particular, the material of interest in the disclosed technology is porous low-k dielectric material, which may be an oxide of a semiconductor material treated to obtain increased pore volume or porosity and thereby further lower the dielectric constant. Porous low-k dielectric material may be produced by a sol-gel technique or by deposition of an oxide layer, for example, by Chemical Vapour Deposition, together with a porogen, a material that can be removed after deposition of the layer so as to create the pores. The treatments used to remove porogens include UV radiation and a plasma treatment, for example an atomic hydrogen cure from a remote $H_2$/He plasma (treatment referred to as ash cure). In an embodiment, a porous low-k dielectric material is a material with porosity higher than about 10% and up to about 60%. In an embodiment, the porous low-k dielectric material is a material with porosity higher than about 20% and up to about 60%. In an embodiment, the porous low-k dielectric material is a material with porosity higher than about 30% and up to about 60%. A suitable low k dielectric that is applicable in the disclosed technology is carbon doped hydrogenated silicon oxide (SiOC:H).

Further with reference to FIG. 1A, a template layer 3 is deposited on the porous low-k layer 2, for example by a spin-on process. In the description of the embodiment of FIGS. 1A-1L, the template layer 3 is described as a polymer layer, even though other materials may be applied as long as they comply with the abovenamed requirements. In an embodiment, the polymer layer 3 is applied in a thickness between 50 nm and 80 nm.

Figure 1B:
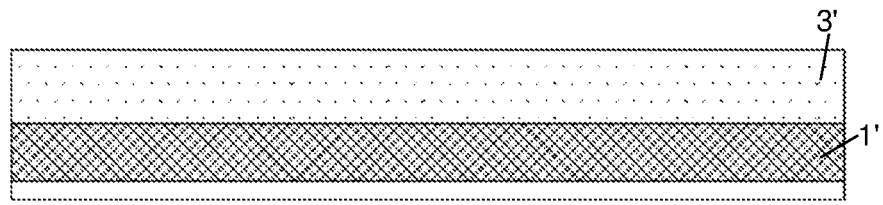
FIG. 1B illustrates an intermediate step of a process flow of a method of manufacturing a metallization layer of an integrated circuit device according to an embodiment of the disclosed technology.

The stack of the low-k porous layer 1 and the polymer layer 3 is then subjected to a thermal anneal at a temperature above the glass transition temperature of the polymer. At this temperature, for example between 250° C. and 400° C. depending on the applied polymer type and molecular weight, polymer diffuses into the pores of the low-k layer, throughout the complete thickness of the low-k layer, resulting in a low-k pore-filled layer 1', as shown in FIG. 1B. The original thickness of the as-deposited polymer layer 3 is such that after the annealing step and a subsequent cooling step, a solid polymer layer 3' remains on top of the pore-filled layer 1', the layer 3' having at least the thickness of the trench level of the metallization layer that is to be produced.

Figure 1C:
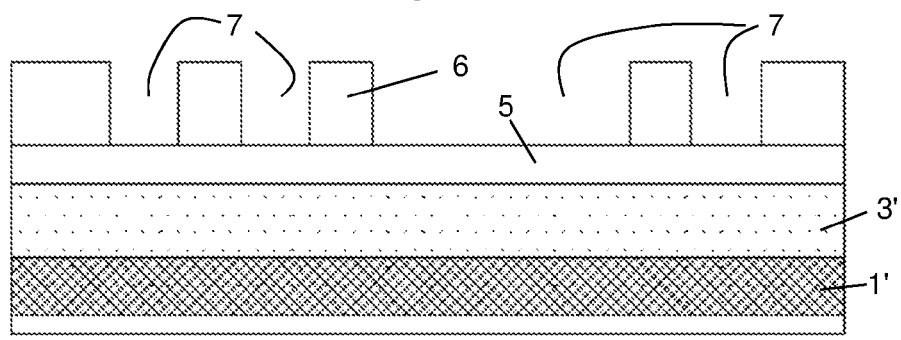
FIG. 1C illustrates an intermediate step of a process flow of a method of manufacturing a metallization layer of an integrated circuit device according to an embodiment of the disclosed technology.
Figure 1D:
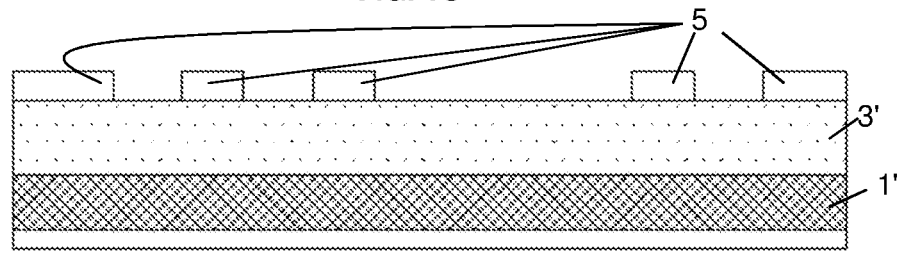
FIG. 1D illustrates an intermediate step of a process flow of a method of manufacturing a metallization layer of an integrated circuit device according to an embodiment of the disclosed technology.

As shown in FIG. 1C, these steps are followed by the deposition of a hardmask 5, for example a silica or metal hardmask, deposited by any suitable method known in the art. A resist 6 is then deposited and patterned in accordance with the pattern of the trench level of the metallization layer that is to be produced. In other words, the open areas 7 in the patterned resist define areas where metal conductors are to appear in the upper level of the metallization layer. The resist pattern is transferred to the hardmask 5 by a suitable etch technique, for example by a fluorine plasma technique. The result of this etching step and stripping of any remaining resist is the process stage illustrated in FIG. 1D.

Figure 1E:
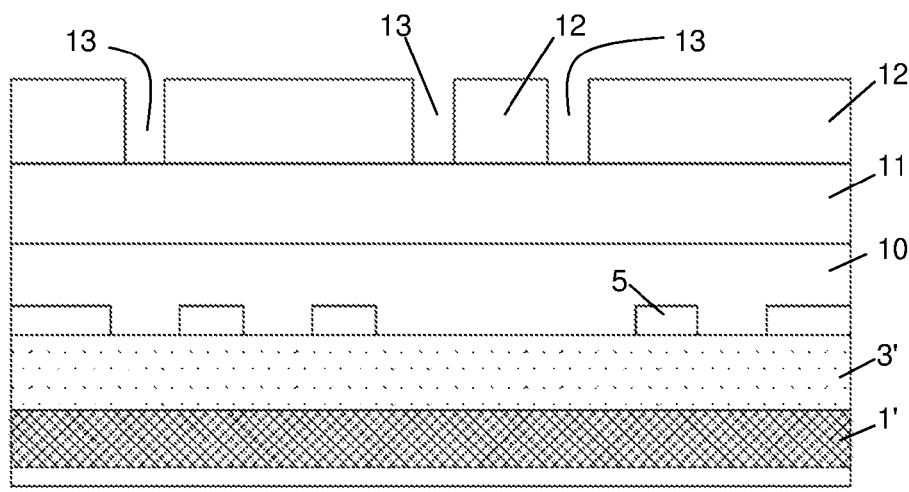
FIG. 1E illustrates an intermediate step of a process flow of a method of manufacturing a metallization layer of an integrated circuit device according to an embodiment of the disclosed technology.
Figure 1F:
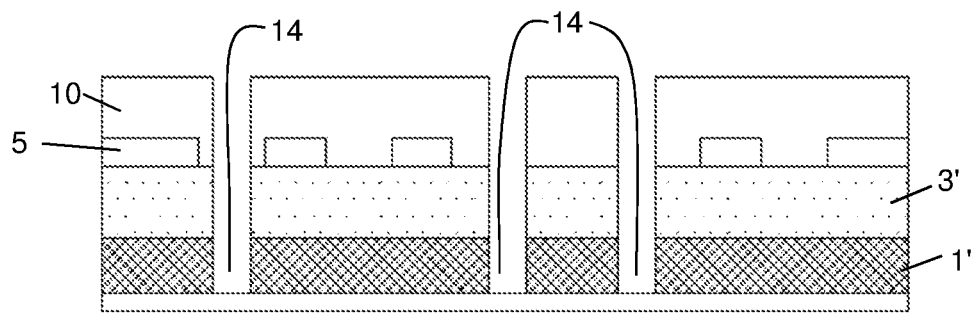
FIG. 1F illustrates an intermediate step of a process flow of a method of manufacturing a metallization layer of an integrated circuit device according to an embodiment of the disclosed technology.

Then a carbon based hardmask 10, a silica hardmask 11 and a second resist 12 are deposited, as shown in FIG. 1E. The resist 12 is patterned in accordance with the pattern of the via level of the metallization layer that is to be produced. In other words, the open areas 13 in the patterned resist define areas where metal-filled vias are to appear in the lower level of the metallization layer.

The silica hardmask 11 is first etched in the open areas 13, by a fluorine plasma etch, stopping on the carbon-based mask 10, provided that the fluorine etch chemistry is chosen so that the etch is selective with respect to the carbon-based mask 10. Then the carbon-based mask 10 and the polymer layer 3' are etched in the areas 13. When the polymer 3' is carbon based, this may be achieved by a single N/H/O plasma etch step. Otherwise, separate etching steps may be required for etching the mask 10 and the polymer 3'. In an embodiment, the resist 12 is consumed while etching the carbon-based mask 10 and/or the polymer layer 3'.

Finally, the pore-filled low-k layer 1' is etched in the areas 13 by a fluorine plasma etch, thereby creating vias 14 in the low k layer 1'. The sidewalls of the low-k vias 14 are protected from being damaged by the plasma etch because of the polymer pore filling. The fluorine plasma etch may consume the silica-based mask 11 completely, or any remains from this mask may be removed by a wet cleaning step (e.g. HF clean), resulting in the process stage illustrated in FIG. 1F.

Figure 1G:
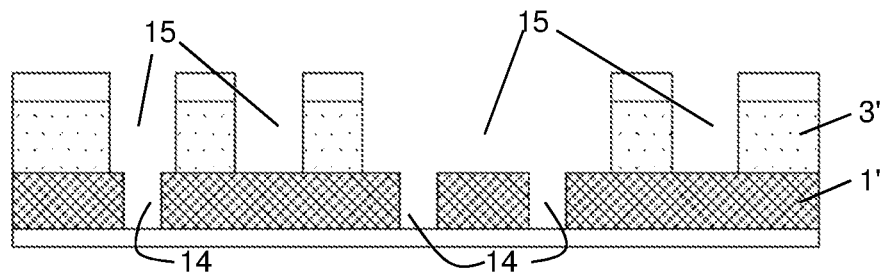
FIG. 1G illustrates an intermediate step of a process flow of a method of manufacturing a metallization layer of an integrated circuit device according to an embodiment of the disclosed technology.

Then the structure is subjected to an etching process that consumes the carbon-based hardmask 10 and the polymer layer 3', while being selective to the silica-based or metal hardmask 5 and to the low-k material 1'. In other words, as illustrated in FIG. 1G, this etching process produces trenches 15 in the polymer layer 3', according to the pattern defined by the hardmask 5. As the etch process is selective to the low-k material, the etching stops at the surface of the pore-filled low-k layer 1'. In an embodiment, the etch time is controlled by end-point tracing, in order to avoid removing polymer from the pores of the low-k layer 1'. When the polymer 3' is carbon based, this step may be achieved by a single N/H/O plasma etch.

Figure 1H:
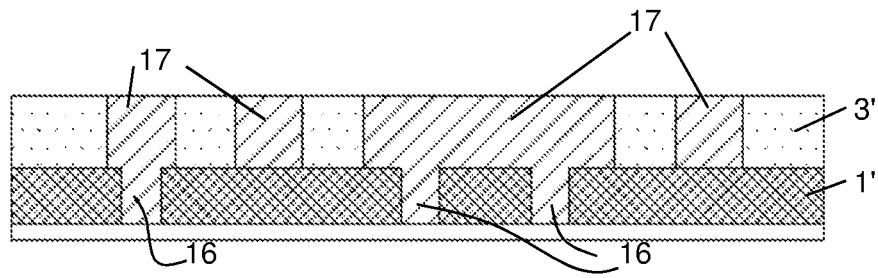
FIG. 1H illustrates an intermediate step of a process flow of a method of manufacturing a metallization layer of an integrated circuit device according to an embodiment of the disclosed technology.

The next step is illustrated in FIG. 1H. A metal diffusion barrier (not shown), for example a Ta or Ru layer or other suitable barrier known in the art, is deposited on the bottom and sidewalls of the vias 14 and the trenches 15, followed by the deposition of metal in these vias and trenches, which results in the creation of metal-filled vias 16 and metal conductors 17. In an embodiment, this is done by electroplating of copper (preceded by deposition of a Cu seed layer as known in the art). Alternative suitable metals are cobalt or ruthenium. A chemical-mechanical polishing step is then performed to remove the metal and the mask 5 from the upper surface of the polymer layer 3', resulting in the process stage shown in FIG. 1H.

Figure 1I:
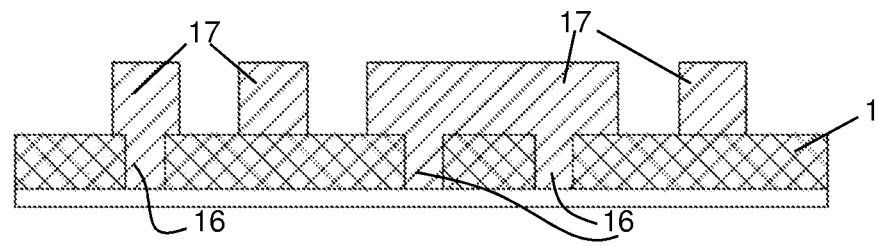
FIG. 1I illustrates an intermediate step of a process flow of a method of manufacturing a metallization layer of an integrated circuit device according to an embodiment of the disclosed technology.

Then the polymer layer 3' is removed together with the removal of the polymer from the pores of the pore-filled layer 1'. The result is shown in FIG. 1I. The porous low-k layer 1 is restored to its initial porosity and the polymer layer 3' is removed, leaving the metal conductors 17 exposed above the low-k layer 1. This step may be achieved by a thermal anneal, a wet cleaning, a microwave anneal, a laser anneal, $H_2$ plasma treatment or UV radiation, all of which are known methods for removal of a polymer layer and for removal of polymer from pores in a porous dielectric layer. In order to avoid damaging the metal conductors 17, a preferred method of removing the polymer involves low temperatures, an oxygen free environment and a short treatment time. With regard to these requirements, UV radiation is the preferred method, for example UV with wavelength >190 nm, inert gas protection, temperature at 350-400° C.

Figure 1J:
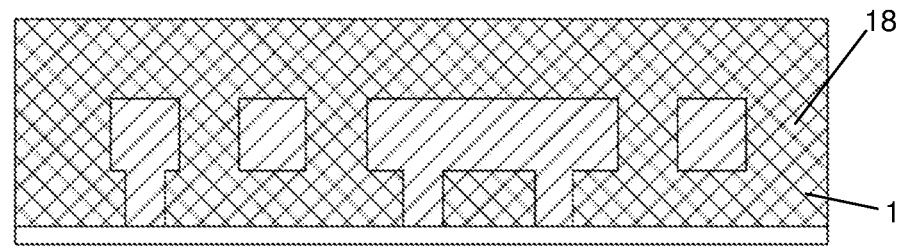
FIG. 1J illustrates an intermediate step of a process flow of a method of manufacturing a metallization layer of an integrated circuit device according to an embodiment of the disclosed technology.
Figure 1K:
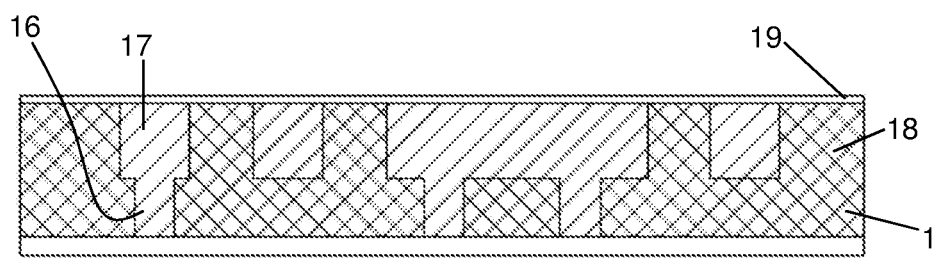
FIG. 1K illustrates an intermediate step of a process flow of a method of manufacturing a metallization layer of an integrated circuit device according to an embodiment of the disclosed technology.
Figure 1L:
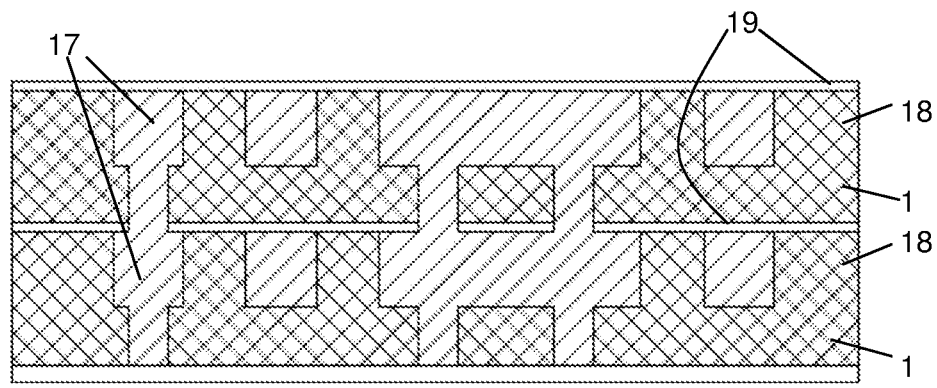
FIG. 1L illustrates an intermediate step of a process flow of a method of manufacturing a metallization layer of an integrated circuit device according to an embodiment of the disclosed technology.

Following this, the gaps between the metal conductors 17 are filled by deposition of a second low k porous dielectric layer 18, as shown in FIG. 1J. This may be done by CVD or by a spin-on technique. The second layer 18 merges with the first layer 1 to form a uniform low-k layer in which the metal filled vias 16 and conductors 17 are embedded. Finally, a planarization is performed, wherein the excess low-k material of the second dielectric layer 18 is removed and wherein this second dielectric layer 18 and the upper surface of the conductors 17 are planarized. In an embodiment, this is done by CMP. After the planarization, the upper surface of the conductors 17 is exposed. In preferred embodiments therefore, a passivation layer 19 is applied on the planarized surface, e.g. a layer of SiCN, primarily for protecting the conductors 17 from oxidation, see Figure IK.

The above-described method steps may be applied again on the surface of the passivation layer 19, to create additional metallization layers in a BEOL stage of an IC production process, see Figure IL. The via etch in this case must also open up the passivation layer 19 of the underlying metallization layer, in order to establish the contact between the two metallization layers, see FIG. 1L.

Figure 2A:
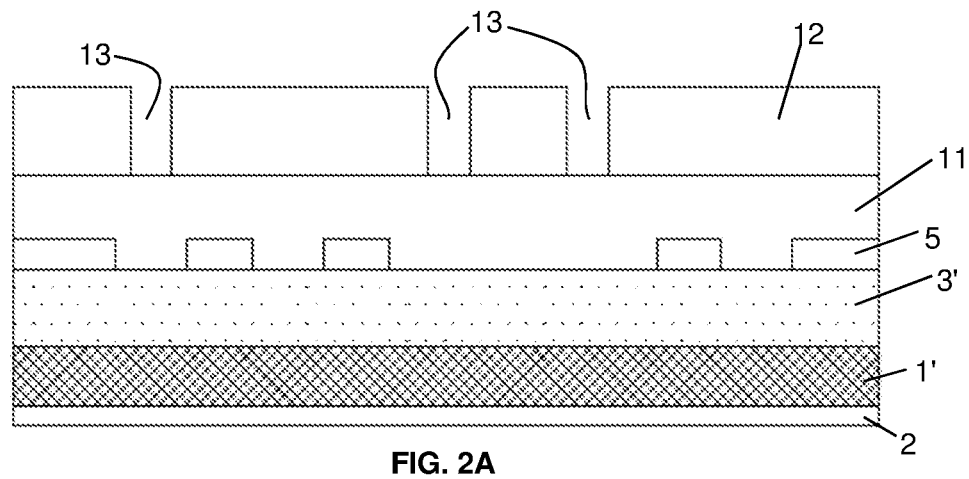
FIG. 2A illustrates an intermediate step of a process flow of a method of manufacturing a metallization layer of an integrated circuit device according to an embodiment of the disclosed technology.
Figure 2B:
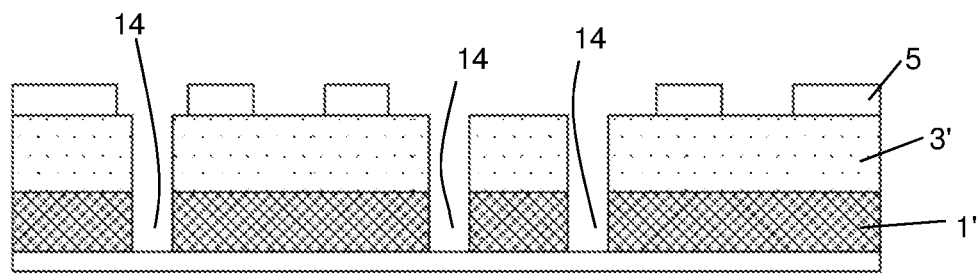
FIG. 2B illustrates an intermediate step of a process flow of a method of manufacturing a metallization layer of an integrated circuit device according to an embodiment of the disclosed technology.
Figure 2C:
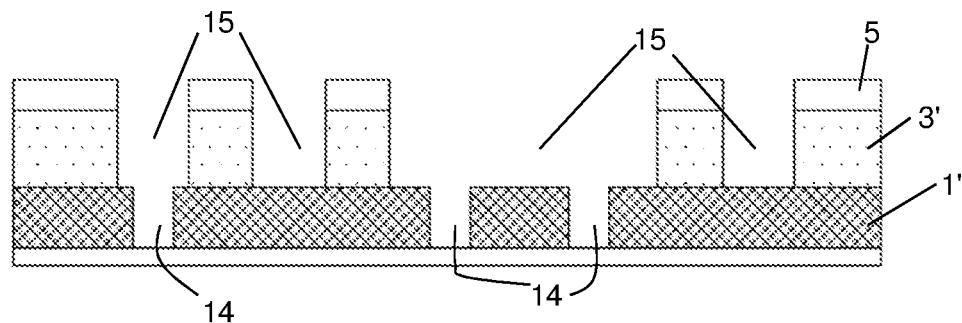
FIG. 2C illustrates an intermediate step of a process flow of a method of manufacturing a metallization layer of an integrated circuit device according to an embodiment of the disclosed technology.

Alternatives for the above-described process are possible within the scope of the disclosed technology. For example, when the hardmask 5, deposited on the polymer layer 3, is a metal hardmask, such as for example a hardmask formed of TiN, $Al_2O_3$, $ZrO_x$ or $TiO_x$, the silica mask 11 can be deposited directly on the hardmask 5. This is illustrated in FIG. 2A. By a fluorine plasma, the via etch is then done first through the silica hardmask 11, stopping on the surface of the polymer layer 3'. Then an H/N/O plasma etch is done to continue the via etch through the polymer layer 3', stopping on the surface of the pore-filled layer 1', and finally a fluorine plasma etch is done to continue the via etch through the pore-filled layer 1' itself (FIG. 2B). During this last step, the silica mask 11 is consumed completely or partially; if partially, the remains of it may be completely removed by a subsequent wet cleaning resulting in the situation shown in FIG. 2b. As the hardmask 5 is metal, it will not be etched or at least not be significantly etched by the fluorine plasma etch. After this, the trench etch is performed, see FIG. 2C, and subsequently the process runs through the same steps as the ones described in relation to FIGS. 1H-1L.

Figure 3:
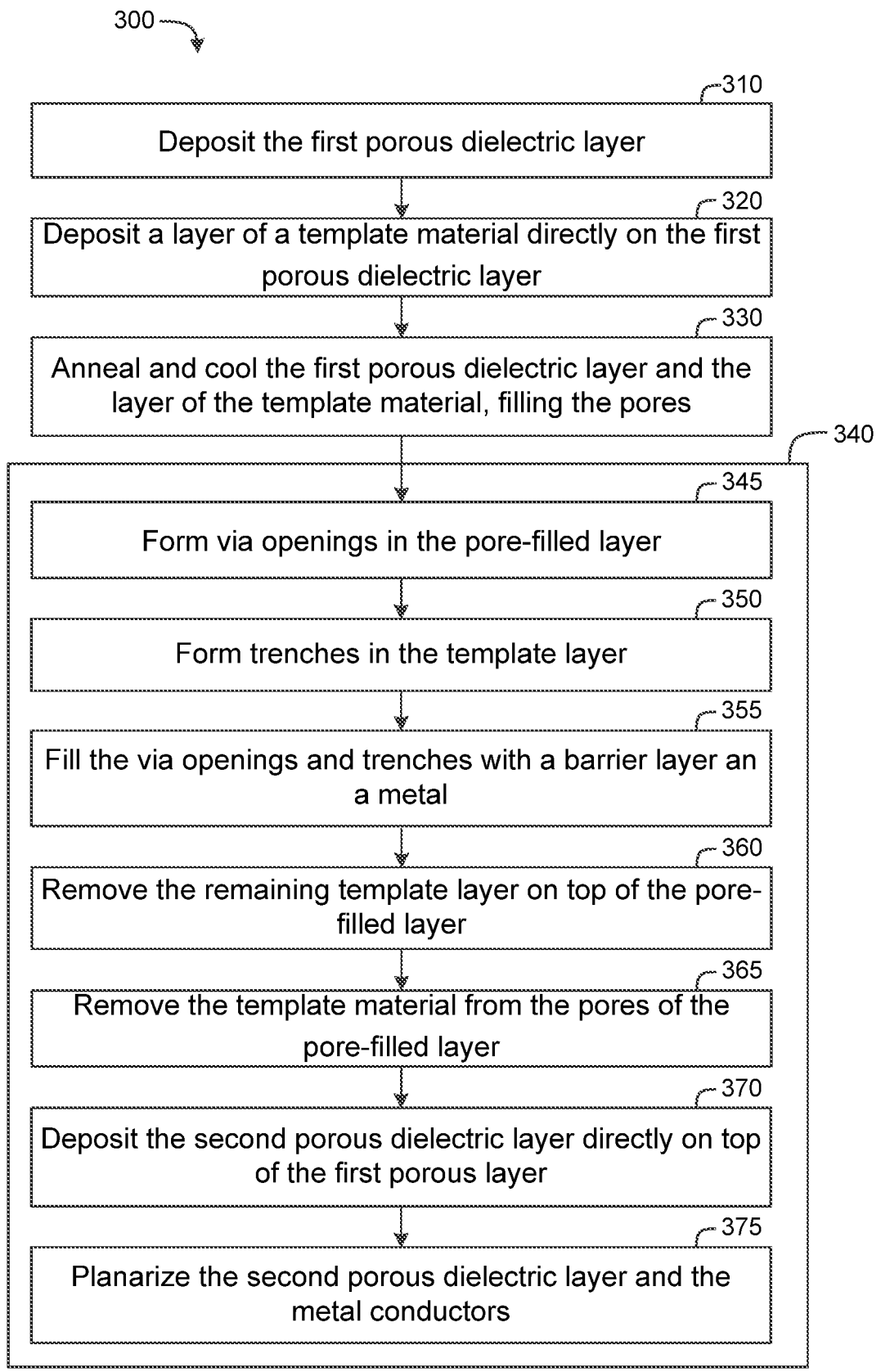
FIG. 3 is a flowchart of a method of manufacturing a metallization layer of an integrated circuit device according to an embodiment of the disclosed technology.

FIG. 3 is a flowchart of a method 300 for manufacturing a metallization layer of an integrated circuit device according to an embodiment of the disclosed technology. The metallization layer includes a via level and a trench level on top of the via level. The via level includes a first porous dielectric layer with a pattern of one or more metal-filled vias embedded therein. The trench level includes a second porous dielectric layer with a pattern of one or more metal conductors embedded therein.

In block 310, method 300 deposits the first porous dielectric layer. In block 320, method 300 deposits a layer of a template material directly on the first porous dielectric layer. In block 330, method 300 anneals and then cools the first porous dielectric layer and the layer of the template material. The template material diffuses into the pores of the first porous layer, filling the pores over the complete thickness of the porous layer and forming a pore-filled dielectric layer, so that a template layer remains on top of the pore-filled dielectric layer.

In block 340, method 300 performs a dual damascene process. The dual damascene process includes blocks 345, 350, 355, 360, 365, 370 and 375. In block 345, method 300 forms via openings in the pore-filled layer according to the via pattern. In block 350, method 300 forms trenches in the template layer according to the conductor pattern. In block 355, method 300 fills the via openings and trenches with a barrier layer and a metal, thereby creating metal-filled vias and metal conductors. In block 360, method 300 removes the remaining template layer on top of the pore-filled layer. In block 365, method 300 removes the template material from the pores of the pore-filled layer. In block 370, method 300 deposits the second porous dielectric layer directly on top of the first porous layer, thereby embedding the metal conductors in the material of the second porous layer. In block 370, method 300 planarizes the second porous dielectric layer and the metal conductors.

The embodiments described above have the advantage that the etching of the vias takes place in a self-aligned way with respect to the pattern of the conductors in the trench level, given the fact that the mask 5 which defines the trench pattern is produced first in the process sequence, i.e. before etching the vias 14. It is however possible also within the scope of the disclosed technology to apply a process sequence known as such in the art, wherein the trench pattern is defined after etching the vias. Also, the processes of FIGS. 1A-1L and 2A-C are examples of the dual damascene method referred to as 'via first', i.e. the etching of the vias takes place before the etching of the trenches. The method is however not limited to processes of this type. A 'trench first' sequence, as known in the art, can equally be applied to a stack of a pore-filled low k layer and a polymer layer, as is clear to the person skilled in the art.

Advantages of the method according to any embodiment of the disclosed technology have been indicated above: protection of the porous low-k material during plasma etching and metal filling of the vias. In addition, the etch chemistry for etching the template layer 3' can be chosen to be selective with respect to the pore-filled low-k layer 1', so that an etch stop layer between the low k layer and the template layer is not required. Such an etch stop layer generally has a higher k-value, thereby increasing the overall k-value of the dielectric. Another advantage is that the metal diffusion barrier layer deposited on the sidewalls of the vias 14 can be chosen thinner in comparison to existing methods where the vias are produced in porous low-k material, which requires a thicker metal barrier in order to seal completely the porous low-k surface and form a continuous thin barrier layer. In an embodiment, the thickness of the barrier layer applied is between 1 nm and 3 nm.

Unless specifically specified, the description of a layer being present, deposited or produced 'on' another layer or substrate, includes the options of the layer being present, produced or deposited directly on, for example in physical contact with, the other layer or substrate, and the layer being present, produced or deposited on one or a stack of intermediate layers between the layer and the other layer or substrate.

While certain embodiments have been described, these embodiments have been presented by way of example only, and are not intended to limit the scope of the disclosure. Indeed, the novel devices, systems, apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments.

What is claimed is:

1. A method of manufacturing a metallization layer of an integrated circuit device, the metallization layer comprising a via level and a trench level, the trench level on top of the via level, the via level comprising a first porous dielectric layer with a pattern of one or more metal-filled vias embedded therein, the trench level comprising a second porous dielectric layer with a pattern of one or more metal conductors embedded therein, the method comprising:
    depositing the first porous dielectric layer;
    depositing a layer of a template material directly on the first porous dielectric layer;
    annealing and cooling the first porous dielectric layer and the layer of the template material so that the template material diffuses into the pores of the first porous layer, thereby filling the pores over the complete thickness of the porous layer, thus forming a pore-filled dielectric layer, and so that a template layer remains on top of the pore-filled dielectric layer; and
    performing a dual damascene process comprising:
        forming via openings in the pore-filled dielectric layer according to the via pattern;
        forming trenches in the template layer according to the conductor pattern;
        filling the via openings and trenches with a barrier layer and a metal, thereby creating metal-filled vias and metal conductors;
        removing the remaining template layer on top of the pore-filled dielectric layer;
        removing the template material from the pores of the pore-filled dielectric layer;
        depositing the second porous dielectric layer directly on top of the first porous layer, thereby embedding the metal conductors in the material of the second porous layer; and
        planarizing the second porous dielectric layer and the metal conductors.

2. The method of claim 1, wherein the porous dielectric material of the first and second dielectric layers and the template material are chosen in relation to an applied etch process for etching trenches in the template layer, in such a way that the etch process is selective to the pore-filled layer.

3. The method of claim 1, wherein the template material is a polymer.

4. The method of claim 3, wherein the polymer is a carbon-based polymer.

5. The method of claim 1, wherein the first and second porous dielectric layers are low k dielectric layers.

6. The method of claim 1, wherein the barrier layer has a thickness between 1 nm and 3 nm.

7. The method of claim 1, wherein a first hardmask defining the pattern of the trenches is produced directly on the template layer after the annealing and cooling of the first porous dielectric layer and the layer of the template material, wherein at least one further hardmask defining the pattern of the vias is produced on top of the first hardmask, and wherein the etching of the vias precedes the etching of the trenches.

8. The method of claim 7, wherein a second hardmask is deposited directly on the first hardmask, and wherein a third hardmask is deposited directly on the second hardmask.

9. The method of claim 8, wherein forming the via openings comprises:
    etching through the third hardmask, stopping on the second hardmask;
    etching through the second hardmask and through the template layer, stopping on the pore-filled dielectric layer; and
    etching through the pore-filled dielectric layer.

10. The method of claim 8, wherein forming the trenches comprises etching through the template layer, stopping on the pore-filled dielectric layer.

11. The method of claim 8, wherein the first hardmask is a metal or a silica hardmask, wherein the second hardmask is a carbon-based hardmask and wherein the third hardmask is a silica hardmask.

12. The method of claim 7, wherein a second hardmask is deposited directly on the first hardmask.

13. The method of claim 12, wherein forming the via openings comprises:
  etching through the second hardmask, stopping on the template layer;
  etching through the template layer, stopping on the pore-filled dielectric layer; and
  etching through the pore-filled dielectric layer.

14. The method of claim 12, wherein forming the trenches comprises etching through the template layer, stopping on the pore-filled dielectric layer.

15. The method of claim 12, wherein the first hardmask is a metal hardmask and the second hardmask is a silica hardmask.

16. The method of claim 1, wherein the dielectric material of the first and second porous dielectric layers is the same material.

17. The method of claim 1, further comprising depositing a passivation layer on the planarized second porous dielectric layer and the planarized metal conductors.

* * * * *

UNITED STATES PATENT AND TRADEMARK OFFICE
CERTIFICATE OF CORRECTION

PATENT NO. : 9,941,151 B2  
APPLICATION NO. : 15/489584  
DATED : April 10, 2018  
INVENTOR(S) : Liping Zhang et al.

Page 1 of 1

It is certified that error appears in the above-identified patent and that said Letters Patent is hereby corrected as shown below:

On the Title Page

Item (73) Assignees, at Lines 1-2, Change "Katholieke Universiteit Leuyen," to --Katholieke Universiteit Leuven,--.

In the Drawings

On Sheet 5 of 5, (reference Numeral 355) (FIG. 3), at Line 1, Change "an" to --and--.

In the Specification

In Column 2, at Line 60, After "vias" insert --.--.

Signed and Sealed this  
Second Day of October, 2018

Andrei Iancu  
*Director of the United States Patent and Trademark Office*